United States Patent [19]

Gemma et al.

[11] Patent Number: 4,605,452
[45] Date of Patent: Aug. 12, 1986

[54] SINGLE CRYSTAL ARTICLES HAVING CONTROLLED SECONDARY CRYSTALLOGRAPHIC ORIENTATION

[75] Inventors: Anthony E. Gemma, Middletown; James A. Dierberger, Hebron, both of Conn.

[73] Assignee: United Technologies Corporation, Hartford, Conn.

[21] Appl. No.: 330,757

[22] Filed: Dec. 14, 1981

[51] Int. Cl.[4] .............................................. C22C 19/05
[52] U.S. Cl. ..................................... 148/404; 148/410; 148/428; 164/122.2
[58] Field of Search ........ 148/404, 409, 410, 426–429; 164/60

[56] References Cited

U.S. PATENT DOCUMENTS

| | | | |
|---|---|---|---|
| 3,580,324 | 5/1971 | Copley et al. | 164/60 |
| 3,598,169 | 8/1971 | Copley et al. | 164/60 |
| 3,738,416 | 6/1973 | Kear et al. | 164/60 |
| 3,857,436 | 12/1974 | Petrov et al. | 164/60 |
| 3,915,761 | 5/1972 | Tschinkel et al. | 148/32 |

OTHER PUBLICATIONS

Kear et al., "Tensile and Creep Properties of Single Crystal ..." Trans. AIME, vol. 239, pp. 1209–1215, (1967).
Rau, Jr. et al., "Thermal-Mechanical Fatigue ..." STP 520 ASTM (1973).
Gemma et al., "Thermomechanical Fatigue Crack Propagation ... Anisotropic Superalloy" STP 612 ASTM (1977).
Wright et al., "The Influence of Orientation on Fatigue ..." Materials Technology, pp. 31–35, (Spring 1981).

*Primary Examiner*—R. Dean
*Attorney, Agent, or Firm*—C. G. Nessler

[57] ABSTRACT

Alignment of the [001] crystal axis of a face centered cubic metal with the primary z axis of a single crystal article provides good thermal fatigue resistance along the z axis, and minimizes cracking transverse to the axis. However, significant cracking is still observed parallel the z axis in severe applications. This cracking can be reduced by controlling the secondary crystallographic orientation (i.e., orientation of crystal axes within x-y planes transverse to the z axis), to make the [110] crystal axis tangent to the article surface in the region most prone to thermal fatigue cracking. Algorithims derived from empirical relationships enable calculation of the orientation likely to produce improved fatigue resistance. More durable single crystal gas turbine blades result when the [110] crystal axis is made tangent to the blade surface in the critical crack prone regions just behind the leading edge of the airfoil at about 40–80% of the airfoil span. A representative improved gas turbine blade will have a secondary orientation angle α of −10 to +20 degrees, where α is the angle between the [100] crystal axis and the y axis.

11 Claims, 17 Drawing Figures

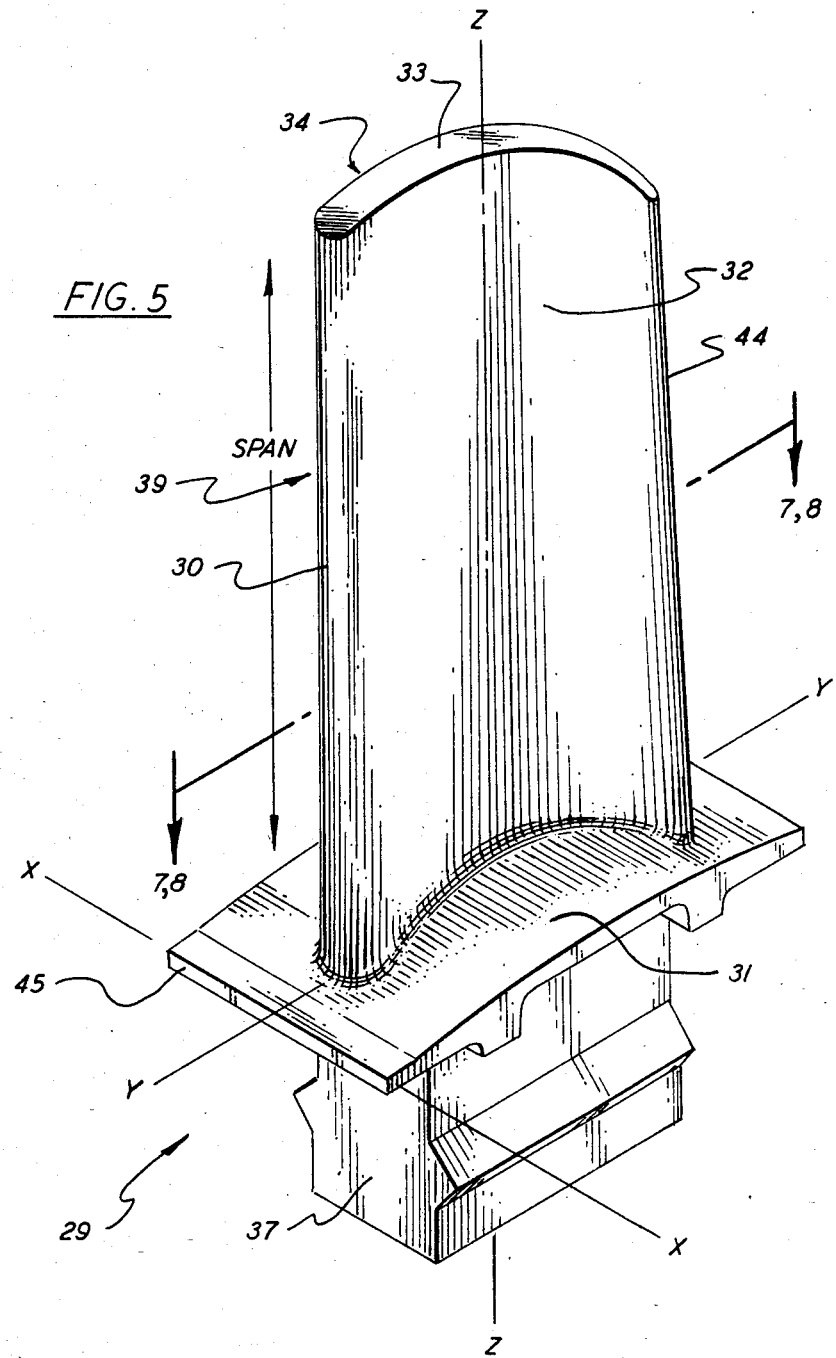

SINGLE CRYSTAL ARTICLES HAVING CONTROLLED SECONDARY CRYSTALLOGRAPHIC ORIENTATION

DESCRIPTION

1. Technical Field

The present invention relates to the orientation of crystallographic axes in single crystal metal parts, most particularly to the secondary orientation of the axes in single crystal gas turbine blades having [001] primary orientation.

2. Background Art

Turbine blades, also generally called turbine airfoils, comprise one of the most technologically demanding and costly elements of modern gas turbines. Mounted in a turbine disk, they spin at high speeds in gas streams of 1500° C. and higher.

The design of an air-cooled gas turbine airfoil involves first selecting an aerodynamic shape, or airfoil. Next, the material and internal mechanical shape of the airfoil must be chosen, and must be able to be feasibly manufactured. The air-cooling must be sufficient to maintain the material within its useful strength range. The airfoil of a blade in a gas turbine is subjected to heat fluxes that vary around its periphery and along its length with time. Thus uneven heating must be met with commensurate cooling. But especially in first stage turbine blades, there is a severe thermodynamic penalty for using excess quantities of cooling air. While it is a primary object of air-cooling to achieve isothermal conditions in the airfoil, due to the great variation in heating loads, they are not attainable. The resultant temperature differences, as well as those associated with starting and stopping the machine cause thermal strains. Accordingly, the thermal strain distribution on a gas turbine part is very complex. In addition, there are varying mechanical loads, both steady and vibratory, due to the spinning of the disk-mounted blade about the main axis of the engine. The combined mechanical and thermal loadings are such that the most deleterious temperatures and primary strains are at the leading edge. Thus, the primary failure mode in polycrystalline equiaxed gas turbine blades has been by cracking perpendicular to the length of the z axis.

In addition to the strains which cause cracking perpendicular to the length of an airfoil, other thermal gradients due to external heat flux and internal air cooling cause secondary strains along the x-y plane, perpendicular to the z axis. Thus, there is also a source for cracking substantially parallel to the length of the airfoil.

Most superalloy gas turbine blades in use heretofore have had isotropic properties. That is, they have been formed of a material with a generally polycrystalline and equiaxed grain structure; the grains are randomly oriented as a natural result of a conventional solidification process. Thus, an equiaxed blade will have a set of properties which does not vary according to the direction in which they are measured.

In the last ten years directional solidification has become a commercial process. The first materials put into use, and those which are today most common, are columnar grain materials, such as disclosed in U.S. Pat. No. 3,620,505 to VerSnyder. When face centered cubic nickel base superalloys, such as alloy MAR M-200+Hf (by weight percent, 9 Cr, 10 Co, 2 Ti, 5 Al, 12.5 W, 2 Hf, 1 Cb, 0.11 C, 0.015 B, balance Ni), are cast in the most common directional solidification process, a multiplicity of polycrystalline columnar grains result. Each columnar grain in a nickel base material is characterized by having its [001] crystal axis in alignment with the solidification growth direction in the absence of purposeful control.

When columnar grain gas turbine airfoils are cast, the [001] crystal axis is most often purposely made to align with the longitudinal (z) axis of the airfoil part, to lower cracking transverse to the z axis. This provides good creep life and thermal fatigue resistance to the critical leading edge region of airfoils. But, while the [001] axes of adjacent crystal columns are coincidental, crystal axes lying in x-y planes perpendicular to the z axis are randomly oriented, from grain to grain. Accordingly, in a columnar grain component there is a first set of properties in the z axis direction and a second set of properties in x-y planes perpendicular to the z axis. In the perpendicular x-y planes, owing to the random orientation of the grains about their growth axes, there is isotropy. Thus, a columnar grain material is two-fold anisotropic, and while a part made of the material is very resistant to thermal fatigue failure along the z axis, in the x-y plane properties are substantially unchanged compared to conventional equiaxed materials.

The most advanced form of directionally solidified turbine blade material is that embodied by the single columnar grain or crystal, as disclosed in U.S. Pat. No. 3,494,709 to Piearcey. A preferred method of making single crystal parts is to use a specially shaped mold which selects one of the crystal columns from a solidifying polycrystalline columnar grain casting, and causes it to grow to form the desired part.

When the single crystal nickel alloy airfoils are thus made, the [001] crystal axis will be made to preferably lie within 20 degrees of the longitudinal z axis, as taught by the Piearcey patent. The z axis orientation is called the primary orientation. And while other primary orientations are possible, the [001] orientation is preferred for best z axis thermal fatigue resistance. The considerations and material behavior leading to this choice are referred to in the article "Tensile and Creep Properties of Single Crystals of the Nickel Base Superalloy MAR M-200" by B. H. Kear and B. J. Piearcey, Transactions of the American Institute of Metallurgical Engineers, Vol. 239, pg. 1209-15 (1967).

However, for a part made of a face centered cubic single crystal nickel alloy, with a [001] primary orientation, it is found that there is anisotropy in properties within x-y plane. For example, the modulus of elasticity is 28% greater in the [011] direction than in the [001] direction. Thus, with different properties along the 011, 001 and 111 axes, single crystal materials have three-fold anisotropy.

Parts made according to general methods of Piearcey will have varying secondary orientations. That is, the angular bearing of the [100] orientation in x-y planes perpendicular to the z axis will vary at random from part to part. Thus mechanical behavior in directions unaligned with the z axis will vary from part to part, and the durability of parts will be variable. Secondary strains, within the x-y planes, have not been particularly significant in most equiaxed or columnar grain airfoils, for two main reasons: first, the strains are relatively small compared to the primary strains along the z axis. Second, both the prior materials have isotropic properties in the x-y planes. Nonetheless the secondary strains are consequential, as was evidenced by grain boundary cracking of early columnar grain MAR M-200 alloy airfoils. Additions were subsequently made to the alloy, to improve the general x-y plane strength, and decrease secondary cracking. See U.S. Pat. Nos. 3,700,933 to Duhl and 3,711,337 to Sullivan et al. Now with the actual use of single crystal turbine blades, cracking along the z axis has been observed. The cracking must be decreased to improve turbine blade life.

SUMMARY OF THE INVENTION

An object of the invention is to provide single crystal components, made of face centered cubic crystal structure metals, with secondary crystal orientation which provides them with high thermal fatigue resistance.

According to the invention, a single crystal article is provided with a primary crystal orientation, in which the [001] crystal axis is generally parallel to the z axis. The resistance to thermal fatigue cracks running along the z axis will be improved when the [100] crystal axis alignment is controlled, with respect to the z axis, so that the [110] crystal axis becomes approximately tangent to the surface where cracks are expected.

In superalloy blades in common use in gas turbine engines, the predominate region prone to thermal fatigue cracks lies on the convex, or suction, side of the airfoil, between 40-80% of the airfoil span. Thus, the [110] crystal axis is aligned with a tangent to the surface in this region. The location on the surface of an airfoil where the [110] crystal axis is made tangent may be more particularly defined with respect to the dimensions and axes of an airfoil, as indicated in the following description of the best mode, where the terminology is explained.

In a particular embodiment of the invention involving gas turbine blades, the [100] crystallographic axis is made to lie within about 10 degrees negative and 30 degrees positive rotational angle of the y axis. More preferably, the [100] crystallographic axis lies between 0° and 20° positive. In the method of applying the invention, the best secondary orientation (subject to empirical refinement from testing) is provided by performing a three-dimensional finite element thermo-elastic analysis. Data from testing of single crystals, and fracture mechanics theory, provide an algorithim to indicate orientations which provide better fatigue resistance. Included in the algorithim is a Local Anisotropic Damage Parameter.

BRIEF DESCRIPTION OF THE DRAWINGS

FIG. 5 shows a typical gas turbine blade.

BEST MODE FOR CARRYING OUT INVENTION

The description of the preferred embodiment is in terms of a hollow air-cooled gas turbine blade made of the nickel superalloy. However, the invention will be equally usable in gas turbine vanes and any other machine parts which are subjected to severe steady and cyclic temperatures and mechanical stresses which result in material failure.

Figure 1:
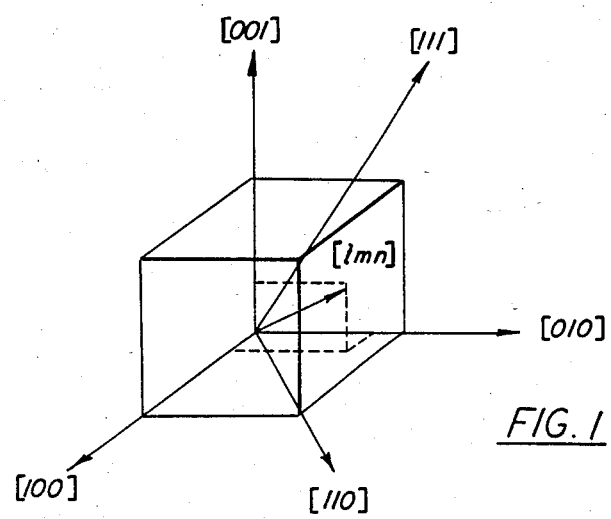
FIG. 1 shows the orientation of the principal cube axes of a face centered cubic crystal.

A better understanding of the invention will be gained by first referring to FIG. 1. Shown are the conventional Miller indices for an octal unit cell of a face centered cubic (fcc) crystal characteristic of nickel and certain other metal systems such as aluminum, copper, etc. The principal axes referred to hereinafter are indicated. In the cubic system, specification of the orientation in space of any two orthogonal axes, such as [100] and [001], will fully define the orientation of a crystal. Because of symmetry, various other directions in a crystal are equivalent. Thus, our discussion herein regarding any particular indices [PGR] will be instructive for a full set of equivalent directions <PGR>.

Properties vary with orientation in a fcc crystal: Referring to FIG. 1, the [010] axis is characterized by the same properties as the [001] axis. Lying in the plane of the [100] and [010] axes is the [110] axis at a 45° angle to the [100] axis. In our present invention, an article has the [001] axis constrained to a particular primary orientation within about 20° of the part z axis. Therefore, our focus is on the orientation taken by the other crystal axes [100], [110] and [010] which lie orthogonal to the [001] axis. The crystal's orientation within a part, and the position of other axes, such as the [111] and [PQR] axes shown for reference in the Figure, will be fully determinable by specifying the spatial orientation for any one of the orthogonal axes, in combination with the specification for the [001] axis.

As a matter of convention, the axes [100], [110] and [010] are characterized herein as "secondary axes", and their orientation with respect to the axes (x, y, and z) of a part is called the "secondary crystal orientation" or simply "secondary orientation". The axis used as a reference for characterizing the secondary orientation herein is the [100] axis. However, it should be evident inasmuch as the axes are fixed by the crystal structure, reference to any other axis would be equally definitive.

Figure 2:
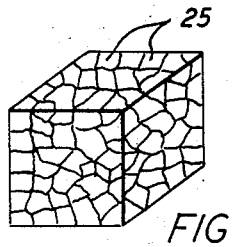
FIGS. 2-4 illustrate the metallographic structure of, respectively, equiaxed polycrystal, columnar grain polycrystal, and single crystal materials.

An equiaxed polycrystal is the characteristic crystallographic structure of a conventionally cast material. As graphically illustrated by the cube part in FIG. 2, the structure is comprised of many randomly oriented small single crystals 25, often called "grains". Thus, the equiaxed material has equal properties in every direction; it is isotropic.

Figure 3:
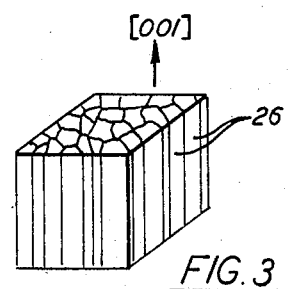

FIG. 3 shows the structure of a directionally solidified polycrystal, with a multiplicity of columnar grains 26. The nature of nickel base alloy solidification is such that the [001] direction will inherently lie along the direction of the solidification, unless seeding or other special techniques are used. Thus, the aligned [001] axes of the separate columnar grains produce an improved set of properties in the direction along which the long grains lie. In the planes perpendicular to the length of the columnar grains the secondary crystal orientations will vary at random. Thus, the material will have two distinct sets of mechanical properties; a first set of longitudinal properties, and a second set of transverse properties. The material is said to be transversely isotropic.

Figure 4:
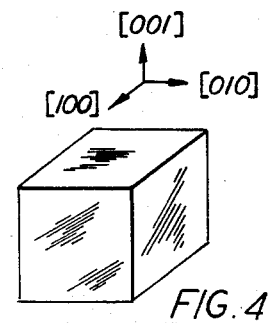

As FIG. 4 illustrates, the structure of a single crystal part is such as to produce three-fold anisotropy. The properties of a part will depend on how the axes of the single crystal are oriented with respect to the part axes.

Cast superalloys are metals especially adapted for high temperature ($\sim$650° C.) service. Single crystal blades may be made from various superalloys, including those derived from the aforementioned MAR M-200 type material and other alloys heretofore used in equiaxed and columnar grain castings. However, the best embodiment of the invention will utilize new nickel alloys developed specifically for single crystal applications, such as those described in U.S. Pat. Nos. 4,116,723 and 4,209,348 to Duhl et al, the disclosures of which are hereby incorporated by reference. Generally, these newer gamma-gamma prime superalloys have simpler chemistry and higher operating temperatures. Nonetheless, it will be appreciated that the invention will be useful not only with nickel alloys, but with face centered cubic structure alloys of cobalt, iron and other metals.

Figure 6:
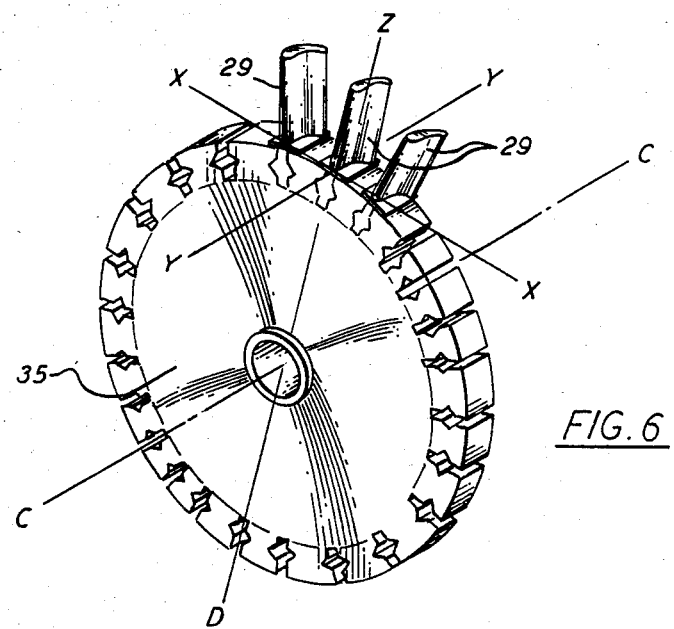
FIG. 6 illustrates how blades mount in the disk of gas turbine engine, to illustrate together with FIG. 5 the conventions for axes of the blade.

There are conventions regarding the axes and terminology of turbine blades necessary to appreciate various aspects of the invention. FIG. 5 shows a blade 29 suited for mounting in a turbine disk 35 of a gas engine. According to a well-known convention, the airfoil has superimposed on it mutually orthogonal x, y, and z axes. The references for these axes are the axes of the gas turbine engine, as illustrated by those of the engine disk 35, shown in FIG. 6, in which the blade is mountable. The y axis is parallel to the centerline c—c of the engine about which the disk rotates. The z axis coincides with a diameter D of the engine. The x axis is mutually perpendicular to the z and y axes. The stacking line, which is a reference line commonly used to designate the position in space of planar cross sections, lies along the z axis.

Referring again to FIG. 5, a blade 29 has a root portion 37 for mounting in the disk and an airfoil portion 39 for receiving gas impingement. The airfoil has a concave side 32, also called the pressure side, and a convex side 34, also called the suction side. At the base of the airfoil is a platform 31, generally transverse to the airfoil. In use, the forward or leading edge region 30 tends to become especially heated as an airfoil is subjected to impingement of hot gases. The trailing edge 44 also becomes relatively hot compared to the bulk of the airfoil, owing to difficulties in cooling this region. The "span" of the airfoil is the z axis distance between the upper surface of the platform 31 and the tip. Locations along the span are specified in terms of percent of the distance, with zero being at the platform surface and 100 being at the tip 33.

Figure 7:
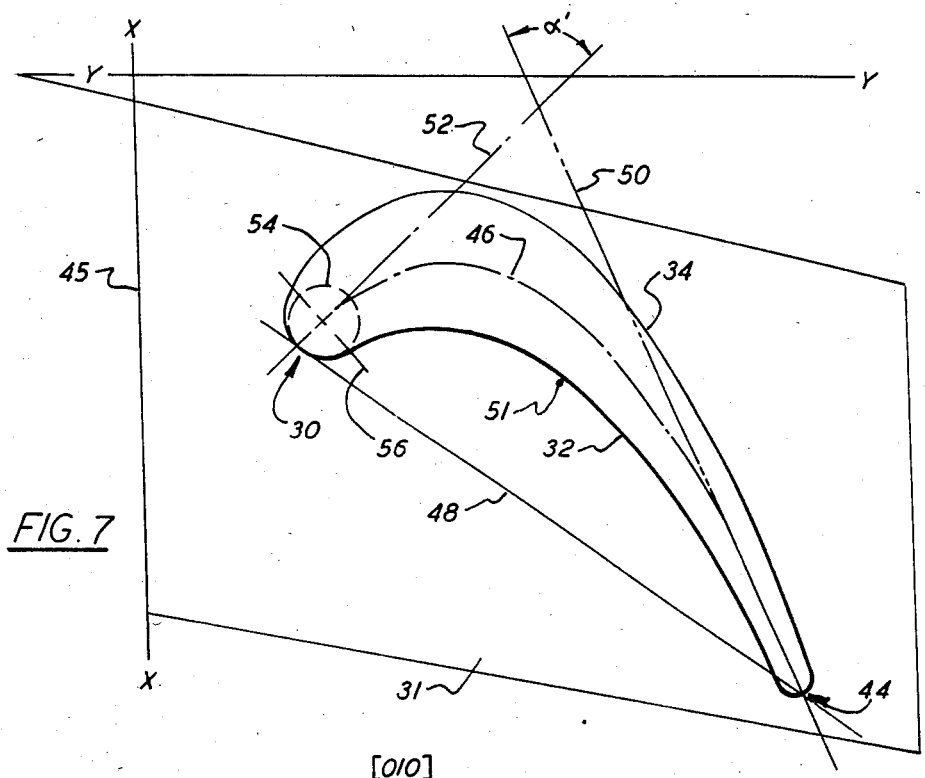
FIG. 7 is a cross-section through the midspan of the airfoil portion of the blade in FIG. 5, showing various geometrical relationships and conventions.

FIG. 7 is a cross-sectional view of the airfoil portion of the blade in FIG. 5, with the platform 31 shown and any internal airfoil configuration omitted for clarity. As is most common, it is seen that the front edge 45 of the platform 31 aligns with the x axis. Running down the centerline of the airfoil cross section is the mean camber line 46, an imaginary line equidistant from the concave surface 32 and convex surface 34. Connecting the intersections of the mean camber lines with the leading edge surface and trailing edge surface is the chord 48. An imaginary line 50 is tangent to the mean camber line at the trailing edge; another line 52 is similarly tangent at the leading edge; they intersect to form an angle $\alpha'$ the turning angle of the airfoil. This angle is a measure of the camber. The stacking point, or the intersection of the z axis stacking line with the x-y plane, is visible as a point 51. The radius of an imaginary leading edge circle 54, which is substantially fitted to many points around the leading edge, enables definition of the nominal radius of the leading edge. A diameter 56 of the circle 54 is normal to the mean camber line; this is discussed further below.

Of course, imperfections in manufacture, wear, and special design considerations may cause the leading edge to have a shape other than an exact segment of a circle. But there will still be a leading edge circle which may be made to substantially correspond with the contour of the leading edge for definitional purposes, herein and elsewhere.

As used herein, the "leading edge" refers generally to the region at most forward part of the blade, in the vicinity of the leading edge circle. The intersection of the loci of the mean camber lines with the leading edge surface is called herein the "leading edge line". Analogous terminology is used for the trailing edge.

Figure 8:
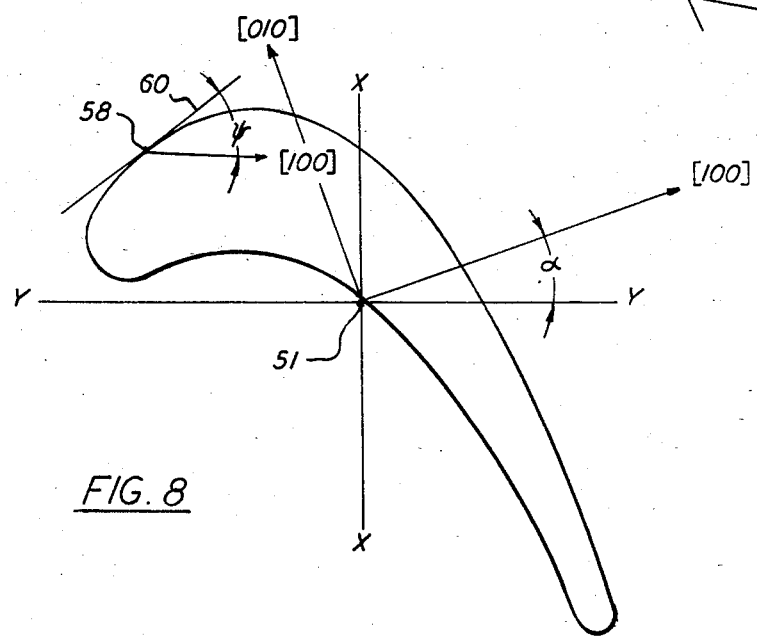
FIG. 8 is a cross-section similar to that shown in FIG. 7, indicating the conventions used in defining the relationships of crystallographic axes to the global axes of an airfoil section.

As disclosed further below the [001] crystal axis is aligned within 20° of the z axis. Thus [001] is the primary orientation. A convention has been constructed for defining the secondary orientation. This is illustrated by FIG. 8, an x-y cross section of an airfoil. The z axis is indicated by the stacking point 51. The angle $\alpha$ between the [100] axis and the y axis is used to define the secondary orientation. (For cases where the [001] axis is not perfectly aligned with the z axis, the angle $\alpha$ will be the angle between the y axis and the projection of [100] axis into the x-y plane.) At any point 58 on the surface of the airfoil there will be an angle $\psi$ which the [100] axis makes with the tangent 60 to the surface at the point. Thus the angle $\alpha$ defines the secondary orientation in a part. The angle $\psi$ enables definition of the crystal orientation and properties in the x-y plane at a point on the surface, with reference to the properties in the part along the [001] axis. In the Figure positive angles are shown counterclockwise. Negative angles will be of opposite rotation. As will be evident upon consideration, there is four-fold symmetry and $\alpha=90°$ will be identical to $\alpha=0$. However, because of the asymmetry of the airfoil shape, positive $\alpha$ angles are not mirror reflections of negative $\alpha$ angles. Therefore, we specify $\alpha$ by a positive angle between 0–90 degrees.

During engine operation a blade will be alternately heated and cooled as the engine power levels are changed. This creates thermal strains as the material attempts to differentially expand at the regions of differing temperature. The severity of thermal and mechanical strains tend to preferentially cause cracking in x-y planes along the leading edge in conventional isotropic blades. Since the [001] crystal orientation is particularly suited to providing thermal fatigue resistance, it is generally aligned along the z axis in single crystal blades. This is done in the present invention, within at least 20 degrees. However, the more precise the alignment which is attained, the better.

Figure 9:
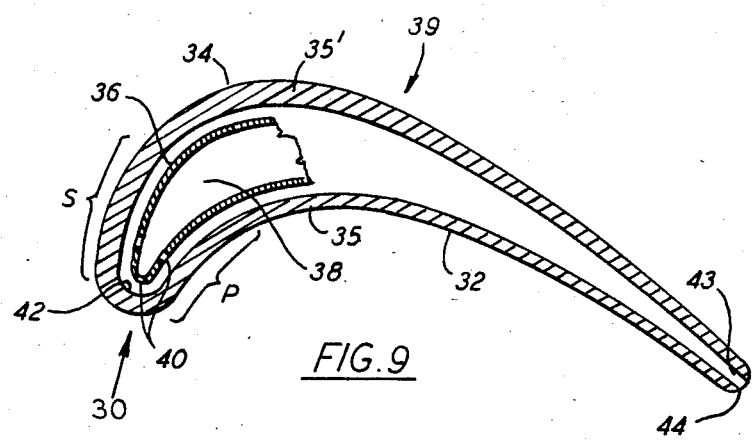
FIG. 9 is similar to FIGS. 7-8, but shows in more detail how a hollow aircooled turbine blade is configured.

There are in addition other thermal stresses, which can be understood from FIG. 9, showing a cross section, of the airfoil portion 39 of the blade in FIG. 5. The airfoil is hollow and has thin suction and pressure side walls 35,35', typically of the order of 0.1 mm thick. A tubular structure 36 runs along the z axis of the airfoil. Cooling air passes along its central passageway 38, to be discharged through ports 40, thereby impinging on the interior surfaces 42 of the airfoil. The flow is preferentially directed to the regions of the airfoil which have higher heat loads, i.e., the leading edge. After flowing about the interior, the air is discharged through slots 43 at the trailing edge 44. In blades of different design, analogous internal configurations carry out substantially the same cooling effects. Heating is concentrated by the on-rushing gas stream at the exterior of the leading edge 30. Thus, there is a thermal gradient through the wall of the airfoil, as the heat is extracted by the cooling air. In addition, it is rare that there will not be a thermal gradient along the length of the wall of the airfoil, running from the leading edge, through the body parts 35,35' of the airfoil walls on both the pressure and suction sides, to the trailing edge. On heating and cooling, the edges tend to go to the extreme points more quickly than the body. Thus, damaging strains are created in the x-y plane as the airfoil cross section attempts to expand non-uniformly. In addition, there are strains created by differences in temperature from one plane along the span, compared to another. Ultimately, fatigue cracks generally parallel to the z axis may result. Because such cracks lie along the span of the airfoil, they are commonly termed "spanwise cracks", and contrasted with the "chordwise cracks" lying in the x-y plane and which occur at the front of the leading edge due to strains along the z axis.

Failure of a part by cracking due to thermal strains is a function of the magnitude of the strains and the ability of the material to resist them. Generally, high temperatures decrease a material's resistive ability. Cracks due to the combination of thermal strains and temperatures which tend to be more damaging are called herein thermally induced failures. In typical blades spanwise cracks are generally concentrated in the rearward region of the leading edge and the body portions just after the leading edge, designated by the brackets and letters S and P in FIG. 9. Empirically, these are determined to be critical regions.

The heat flux and temperatures just described for gas turbine blades similar to that shown in FIG. 5 will vary according to the cross section location along the z axis. In the annular gas stream path of modern gas turbines the most severe heat fluxes and resultant thermal cracks tend most often to be concentrated in a location of about 40–80% span, and more particularly in the 50–70% span region. When analyses are made, such as those described below, attention is usually focused on the 50% span, geometrically. But, often the temperature and imposed stresses corresponding with a more severe section, e.g. 60% span, will be used. There is usually little difference geometrically between the 50 and 60% span cross sections. These and various other practical simplifications and assumptions, well known to those skilled in the turbine blade analyses, do not substantially affect the general validity of the results.

In summary, the critical regions in a blade are those x-y plane surface locations designated S and P in FIG. 9, lying between 40–80 percent of z axis span. These regions are illustrated in the isometric view of a blade, FIG. 17, which is discussed further below.

It should be understood that one complexity in optimizing thermal fatigue life is that strain range at a point varies with the crystal orientation at the point. This is in part reflective of the variation of elastic modulus with crystallographic orientation. Thus, it is not an easy matter of calculating the points of maximum thermal-mechanical damage using isotropic material properties, and then simply making a "good" secondary orientation/properties correspond with the primary strain orientation at these points. Such a procedure would likely be productive of early failure elsewhere, as the strains become more critical with the "poor" orientation/properties the anisotropic crystal structure produces, compared to the "average" orientation/properties the isotropic material produced.

The scope of the invention and its implementation are based on the results of a series of experimental and analytical investigations extending over a number of years. Experimental work, the objective of which was to determine the crack propagation behavior of several nickel and cobalt-based superalloys, involved thermal-mechanical fatigue (TMF) testing. Test conditions were those temperature and strain cycles which were simulative of idealized cycles; that is, they simulated the conditions (mission cycles) to which localized regions of an airfoil are subjected in actual use. Crack propagation is measured. The data obtained was found to obey a simple power-law relationship $$da/dN = C(\Delta K_\epsilon)^n \qquad (1)$$

where
  a = crack length
  N = cycle (TMF cycle)
  C,n = empirical constants dependent on type of TMF cycle
  $\Delta K_\epsilon = \Delta\epsilon \cdot F(g)$ = strain intensity factor
  $\Delta\epsilon$ = strain range
  F(g) = empirical function of crack geometry, g, observed in the material.

See the publication by C. A. Rau et al., "Thermal-Mechanical Fatigue Crack Propagation in Nickel and Cobalt Base Superalloys Under Various Strain-Temperature Cycles" in Amer. Soc. Testing and Methods STP-520, pp. 166–178. (1973). A life-prediction method has been established based on fracture mechanics methodology for film-cooled turbine airfoil configurations, using the crack propagation data as a function of a strain intensity factor. See the publication by A. E. Gemma and J. S. Phillips, "The Application of Fracture Mechanics to Life Prediction of Cooling Hole Configuration in Thermal-Mechanical Fatigue" in Engineering Fracture Mechanics, V9, pp. 25-36 (1977).

Spanwise cracking was found to be much more prevalent in early columnar grain alloy airfoils than spanwise cracking had been in similar airfoils made of equiaxed alloy. Experimental data was acquired to determine how crack propagation rates hollow cylinders of columnar grain alloy MAR M-200 varied with the orientation of uniaxial strain. Analysis of extensive data revealed that crack growth could be correlated with the normalized elastic modulus. That is, the crack growth behavior could be characterized by the equation $$da/dN = C(\lambda \cdot \Delta K_\epsilon)^n \quad (2)$$

where $$\lambda = E_\theta/E_l \text{ and } 0 \leq \theta \leq 90° \quad (3)$$

$E_\theta$ = elastic modulus in the direction of loading
$E_l$ = elastic modulus along the grain growth direction
$\theta$ = angle between loading direction and the [001] crystal axis
$l$ = grain growth direction, [001]

Equation (2) was found to enable successful prediction of crack growth rate. Thus, the life of a specimen could be predicted, when life is defined as constituting a certain maximum crack size.

See the publication by A. E. Gemma et al., "Thermomechanical Fatigue Crack Propagation in an Anisotropic (Directionally Solidified) Nickel Base Superalloy," Amer. Soc. for Testing and Methods STP-612, pp 199-213 (1977). See also the publications by Bizon et al. "Effect of Grain Orientation and Coating on Thermal Fatigue Resistance of a Directionally Solidified Superalloy (MAR-M 247)" Nat. Aero. & Space Adm. Tech. Memo 79129 (April 1979); and by P. K. Wright and A. F. Anderson, "The Influence of Orientation on the Fatigue of Directionally Solidified Superalloys", Materials Technology, pp. 31-35. The latter article shows the failure life of columnar grain nickel alloy parts, strained in different directions is a function of the elastic modulus for the direction, supporting the findings in the ASTM STP-612 article.

Figure 10:
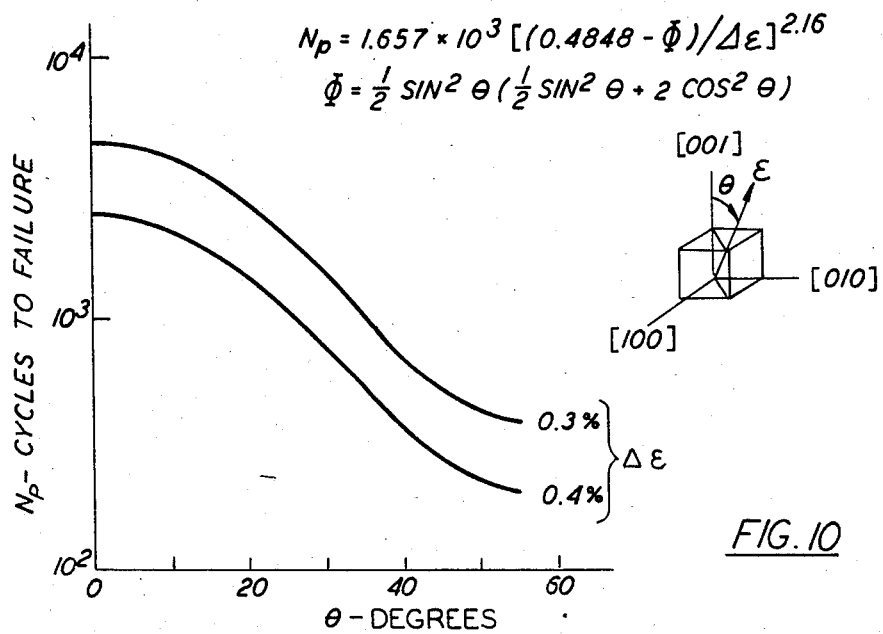
FIG. 10 graphically illustrates the effect orientation of strain, applied to a single crystal structure, has on the fatigue life of the structure.

The foregoing information provided the basis for a fracture mechanics analysis of single crystal parts which resulted in the present invention. Uniaxially stressed hollow cylinders having various single crystal orientations were tested under various TMF conditions to obtain crack propagation data. FIG. 10 shows specimen data for the range 475°-1150° C., where the maximum tensile strain is at the minimum temperature and the maximum compressive strain occurs at the maximum temperature of the cycle, with the angle $\theta$ representing the angle between the strain direction and the [001] axis. It is seen that as the angle $\theta$ increased beyond 20°, life drops substantially, and it is data such as the foregoing which leads to the selecting of [001] as the primary orientation. The [001] axis lying substantially along the z axis is best for most turbine blades which operate at extreme temperatures tend toward TMF failure. (But other considerations may lead to different preferred orientations in blades subject to different failure modes.

Again it was found from the testing that a power type relationship could be used to characterize the temperature-dependent crack growth behavior, according to the orientation of the crack in the crystal, namely, $$da/dN = A_1 \exp(A_2 T)(\lambda \cdot \Delta K_2)^{A_3} \quad (4)$$

where
$A_1, A_2, A_3$ are empirical constants; and
T = maximum cycle temperature; and $$\lambda = \frac{E_{[lmn];\alpha;\psi}}{E_{[001];\alpha=0;\psi}} \quad (5)$$

and where $E_{[001];\alpha=0;\psi}$ and $E_{[lmn];\alpha;\psi}$ are the elastic moduli associated with crystal axes [001] and [lmn] respectively, where l, m, and n are the coordinates of the crystal axis of interest and 0, 0, and 1 are the coordinates of the reference axis of choice. The values of $\alpha$ and $\psi$ are relevant to airfoils, in accord with the conventions in FIG. 8, and will have further meaning in the discussion which follows. The Appendix indicates in more detail how the local elastic modulus may be determined at any location on an airfoil surface.

The effects of secondary orientation were analytically evaluated in a hollow blade with a cross section like that of the Figures, and having a [001] primary orientation. A three dimensional finite element thermoelastic analysis was performed for a first stage impingement cooled turbine blade of a Pratt & Whitney JT9D-7R4 gas turbine, for which the cross-sectional drawings herein approximate the dimensions. The blade was made of an alloy like the preferred alloy of U.S. Pat. No. 4,209,348. The airfoil of the blade has a z length (span) about 10 cm, a leading edge circle diameter of about 3.2 mm, a chord length in the 50-70% span region of about 3 cm, a wall thickness of about 1.3 mm, a camber angle $\alpha'$ of about 86°, and an attack angle of about 64°. The temperatures and imposed strains representative of actual blade were used. The TMF behavior and thermo-physical properties of the material were known from prior testing. Attention is normally focused on the portion in the 40-80% span region, where the component life is found to be most limited. For simplicity of illustration, the data regarding this part hereinafter are those for the 50% span, although it will be understood an entire airfoil is evaluated in the full use of the invention.

Figure 11:
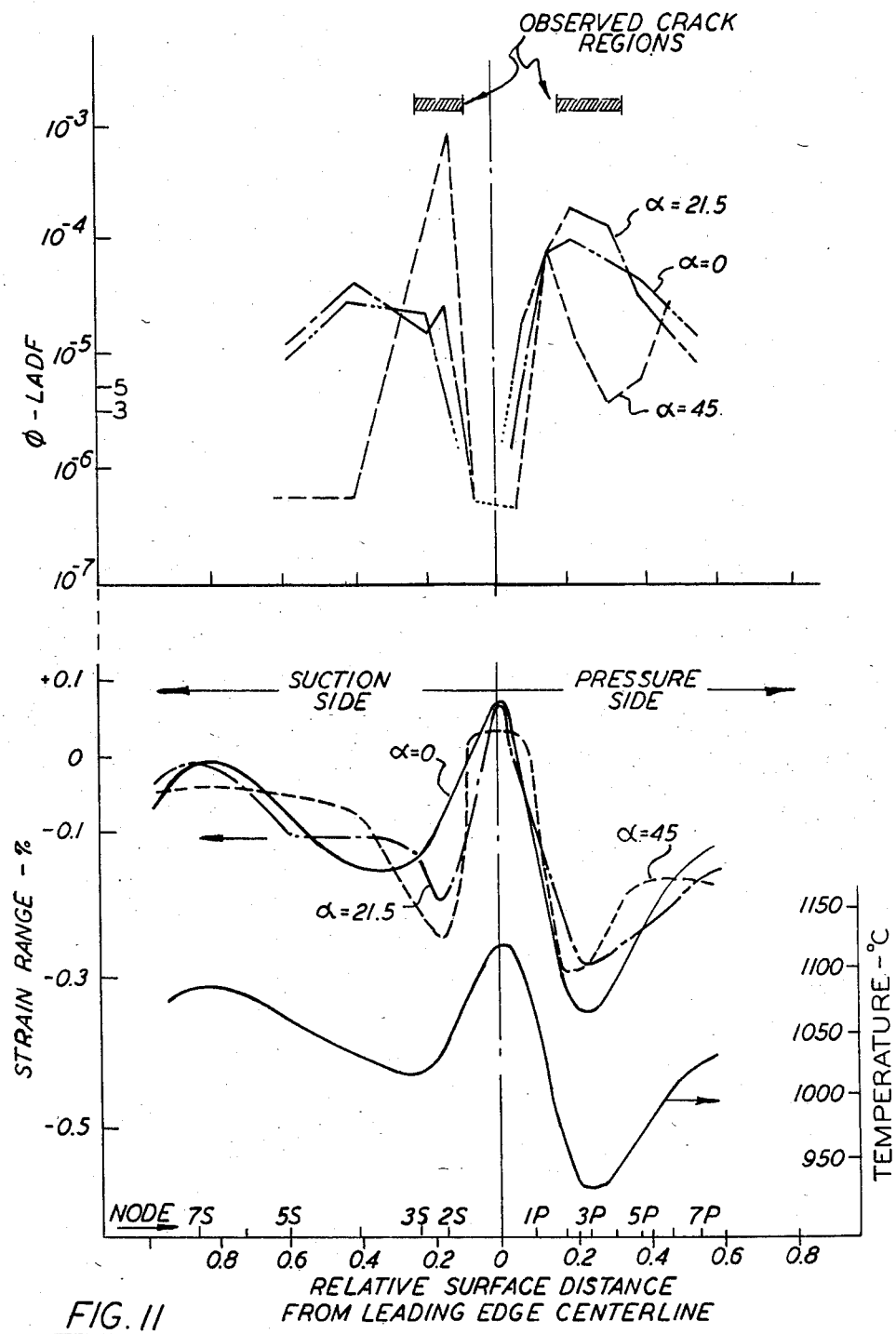
FIG. 11 graphically illustrates, for points on the pressure and suction side of an airfoil near the leading edge region, the variation in temperature, strain range, and local anisotropic damage factor, as a function of the secondary orientation angle of the crystal structure.

A series of analyses was performed for $\alpha = 21.5, 45, 67$, etc degrees. FIG. 11 shows how the chordwise strain range which causes spanwise cracking varied with secondary orientation at different nodal points (2S, 3S, 1P, 2P, etc.) around the surface of the airfoil, as may be measured from the leading edge centerline. It is seen that peak (negative) strains occur in regions just rearward of the leading edge on both the pressure and suction sides. It is also seen in these regions, the spanwise crack prone regions, that the temperatures are high on average, with sharp gradients. The exact location and magnitude of maximum strain is seen to vary with orientation angle $\alpha$. Of course blade life is the result of the combined effects of temperature and strain together with other parameters. To evaluate the thermoelastic analysis data, a Local Anisotropic Damage Factor (LADF) was developed, based on equations (4) and (5). This is summarized as follows.

To repeat from above, the crack growth behavior of a single crystal airfoil is characterized by $$da/dN = A_1 \exp(A_2 T)(\lambda \cdot \Delta K_\epsilon)^{A_3} \quad (6)$$

where $$\Delta K_\epsilon = \Delta \epsilon \cdot F(g) \quad (7)$$

Thus, substituting (7) in (6) and integrating, gives $$N = \frac{\int \frac{da}{F(g)}}{A_1 \exp(A_2 T)(\lambda \cdot \Delta\epsilon)^{A_3}} \quad (8)$$

Assuming that the cracks have the same geometrical shape then $$\int \frac{da}{F(g)} = C = \text{constant} \quad (9)$$

therefore $$N = C/\phi \quad (10)$$

where $$\phi = A_1 \exp(A_2 T)(\lambda \cdot \Delta\epsilon)^{A_3} \quad (11)$$

We designate $\phi$ the Local Anisotropic Damage Factor (LADF) because its value depends on the specific location on an airfoil surface, i.e., according to the local temperature, strain range and orientation parameter $\lambda$.

The LADF was calculated for nodes on the suction and pressure sides of the airfoil, and the data are shown in FIG. 11. Also indicated on the Figure are the regions empirically observed to be prone to spanwise cracking. It is seen that there is a variation in LADF with orientation angle.

In order to evaluate the overall behavior of an airfoil configuration with a particular secondary crystal orientation, we use the Miner rule together with the LADF. The Miner rule is $$\sum_{i}^{m} \frac{N_i}{N_{\theta i}} = 1 \quad (12)$$

where i is a number between 1 and m, representative of physical locations on the airfoil surface;

m is a number which encompasses the physical locations where damage is significant;

$N_i$ is the number of TMF (or mission) cycles to which location i is subjected; and $N_{\theta i}$ is the number of TMF (or mission) cycles which produce failure under conditions at location i, where failure is defined according to a practical criterion, such as depth of cracking.

Since all points on an airfoil will be subjected to the same number of missions, $N_i = N$. Then equation (12) may be rewritten using (10), as $$N = C/D \quad (13)$$

where $$D = \sum_{i}^{m} \phi_i$$

Therefore, calculation of D for different secondary orientations will permit an estimate of the relative life for each orientation. Then the relative TMF lives can be ranked to estimate the relative optimum orientation; i.e. the orientation for which D is a minimum.

Values of D were calculated for the LADF data presented in FIG. 11 and these are shown in Table 1. The greatest values of D for the pressure and suction sides are designated by asterisks. These have associated with them $\alpha$ values for which the shortest life of that side is expectable. Thus, in experimental parts tested to failure, blades with $\alpha = 45°$ would be expected to prevalently have suction side cracks while those with $\alpha = 21.5°$ would be expected to prevalently have pressure side cracks. As a corollary, an airfoil having the characteristic configuration will have optimum life when D is minimized.

TABLE 1

| | Damage Parameter D For An Airfoil | |
|---|---|---|
| | D | |
| $\alpha$ | Pressure Side | Suction Side |
| 0° | $2.989 \times 10^{-4}$ | $5.669 \times 10^{-5}$ |
| 21.5° | *$4.45 \times 10^{-4}$ | $8.332 \times 10^{-5}$ |
| 45° | $1.084 \times 10^{-4}$ | *$8.991 \times 10^{-4}$ |

Those familiar with structural analysis of gas turbine blades and other complex structures will know that the foregoing is a very brief and illustrative description of the complete practice of the invention in a general case. Familiarity with turbine blades enables concentration on the critical areas and supports simplifying assumptions. In the general case of any component, a full analysis of the entire component will be conducted. And while we indicate consideration in our exemplification of only certain spaced apart secondary orientation angles, it will be appreciated that, for the angle $\alpha$ and any other parameter, iteration will be dictated by the significance of change in function with iteration.

Figure 12:
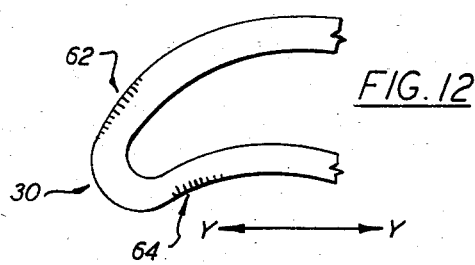
FIG. 12 shows critical regions, for thermal fatigue cracking, in an airfoil x-y cross-section, based on observations in experimentally tested parts.

In addition to the foregoing analytical approach, experimental blades were constructed of single crystal nickel superalloy and experimentally tested in gas turbine engines. The parts had random secondary crystal orientation in combination with [001] primary crystal orientation. They were severely run to cause failure and thereafter analyzed metallographically for correlation between cracking and secondary crystal orientation (which was measured using the Laue radiographic diffraction technique). FIG. 12 illustrates where spanwise cracking occurred with respect to the x-y plane of an airfoil at 50% span. Suction side cracking 62 tended to be more severe in occurrence and depth than cracking 64 on the pressure side.

Figure 13:
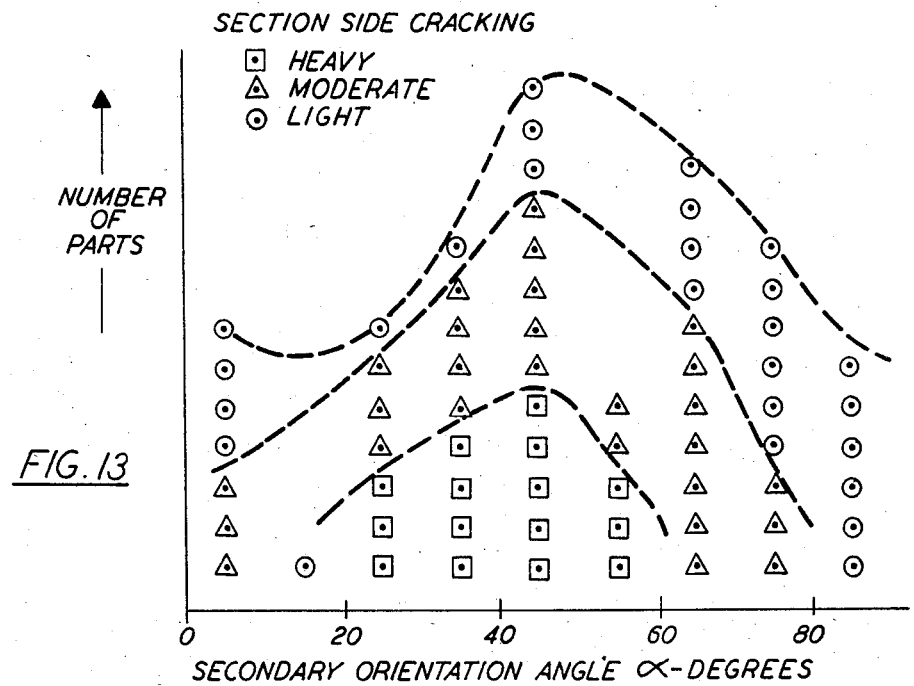
FIGS. 13-14 indicate how thermal fatigue cracking varied in experimentally tested parts, as a function of the secondary orientation angle.
Figure 14:
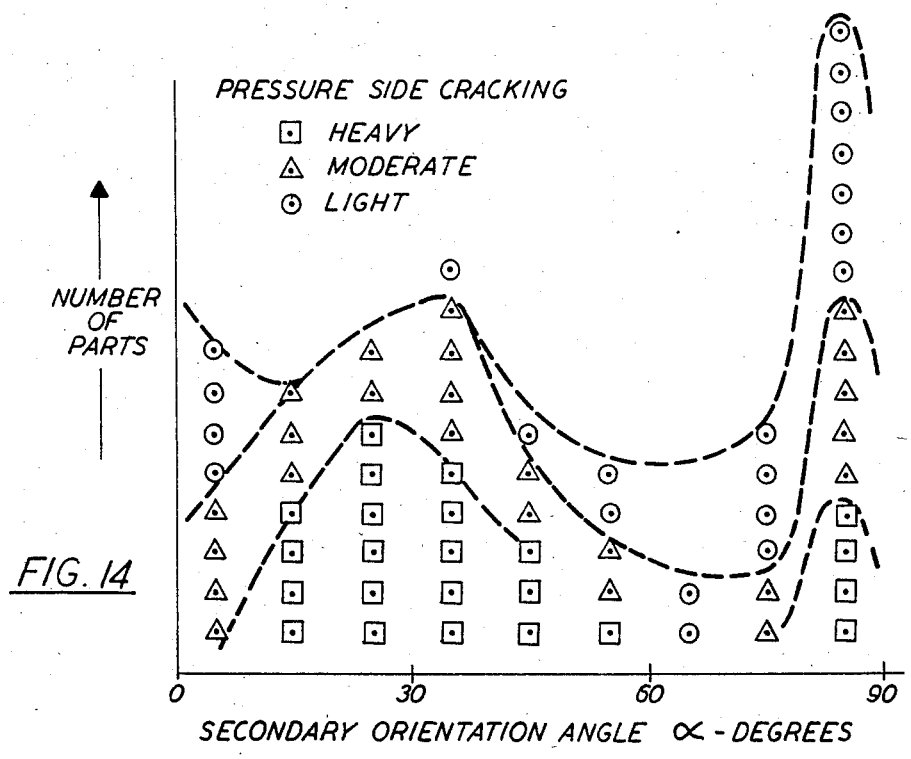

Each side of every part was categorized as having spanwise cracking which was heavy, moderate, or light, according to its occurrence and depth, and further categorizing as falling within a 10 degree increment between 0-90 degrees. In FIGS. 13 and 14, each plotted point represents one blade-side observation. FIG. 13 indicates that minimum suction side cracking occurs for $\alpha = 80°-90°$ and 0-20 (i.e., $\alpha = -10°$ to $+20°$). FIG. 14 indicates that minimum pressure side cracking occurs for $\alpha = 55°-75°$ (i.e., $\alpha = -15$ to $-25$.) The most prevalent cracking on the suction side is associated with $\alpha \neq 45°$. The most prevalent cracking on the pressure side is associated with $\alpha \neq -5$ with a broader peak in the 30° range. In viewing the data it should be understood that they are limited, and that other interacting variables, such as wall thickness, may be operative. Nonetheless the data substantially confirm the analyses.

Figure 15:
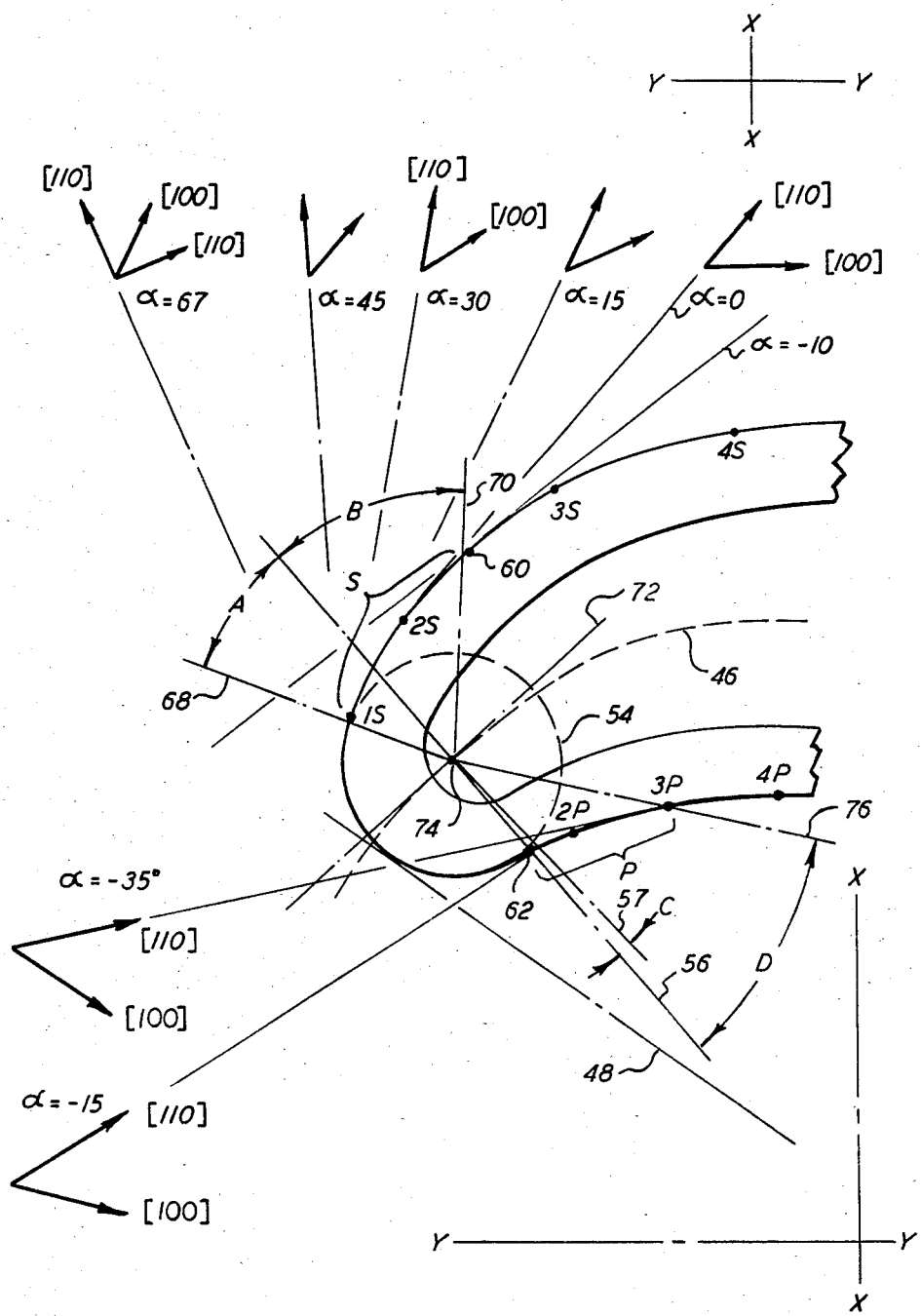
FIG. 15 illustrates in detail the critical crack prone regions, with respect to the geometry of an airfoil, and the manner in which crystal axes are oriented with respect to the airfoil axes for different secondary orientation angles.

FIG. 15 is an expanded view, to scale, of a 50% span x-y section of the hollow airfoil which was analyzed and tested. Marked thereon are the lines representative of the spatial orientation of [110] and [100] when α ranges from 0-90 degrees (0 being identical to 90, by symmetry). The crack prone regions, P and S, based on experimental observations mentioned above are marked in proper scale. The suction side region S extends from about point 1S to about point 60, while P extends from about point 62 to point 3P. When α is in the range of about minus 5 to plus 25 degrees it is observed from the construction that the [110] axis will be parallel to a surface tangent in the region, S. Since the experimental and analytical results indicate the α of −5° to +25° provide superior suction side crack resistance, it may be stated generally that making the [110] crystal axis parallel to a surface tangent provides improved thermal fatigue resistance.

For the gas turbine airfoil section shown in FIG. 15, the suction side surface in which the [110] axis out to tangent to the surface can be defined according to the geometry of the airfoil section. The region S lies between the surface intercepts of the radii 68 and 70 of the leading edge circle. Radius 68 is rotated forward an angle A from the diameter 56 of the leading edge circle 54. The diameter 56 is perpendicular to the tangent 72 of the mean camber line 46 at the center 74 of the leading edge circle. The radius 70 is rotated rearward an angle B from the diameter 56. Thus, the location within which [110] ought to be tangent to the surface is defined by angle A of about 30° and B of about 45° (corresponding to α of about −10 to +30°). The more central part of S, and thus the more preferred values of A and B, are defined at A=25° and B=35° (corresponding with α of about −5° to +20°). The foregoing values are those measurable at the 50% span. Thus, for the entire region lying within 40-80% span of the airfoil, the forward and rearward bounds, along the z axis of the crack prone region within which [110] ought to be made tangent, is defined by th eloci of the radii 68,70 for the x-y planes within the 40-80% span, as shown by lines 76, 78 in FIG. 16.

Corresponding observations may be made of the pressure side. Again [110] is found tangent in the region P when least blade cracking occurs. FIG. 15 shows that the region P may be defined with respect to geometry, as was region S. P may be defined as the surface region lying between the intercept points of radius 57 and radius 76, respectively rotated angles C and D from the leading edge circle diameter 56. For region P as shown (α=−15° to −35°) C is about zero degrees and D is about thirty-five degrees. For the more central part of the region C is about 5° and D about 30° (corresponding to α=−10° to −20°). Along the 40-80% span of a blade, the crack prone region where [110] tangency is desired would be defined by loci analogous to the discussion for the S region.

It should be evident from the discussion that the making of [110] tangent to the surface in a particular critical thermal fatigue crack prone region will optimize the performance of that region, but may disadvantageously orient the crystal axes with respect to another region on the same part. This is the case above where the S region is optimized; both P and S cannot be simultaneously optimized in the unitary crystal structure blade. The experimental data and analyses of the blade indicate that the S region is more crack prone. Thus, optimizing the S region produces optimum part life.

Viewing the data in FIGS. 13, 14 show, e.g., that the α=0°-20° which gives good results for the suction side produces relatively low cracking on the pressure side. The best trade-off of one side versus another, and the best α, will be determined through the use of our analytical technique, followed by empirical observation of tested A parts.

Components such as airfoils ordinarily have "twist". That is, the camber, chord length, turning angle α′, and other dimensions vary with z axis location. Thus, different α values may be optimal at different z axis locations where they are considered in isolation. The selection of a single α (assuming α is constant along the z axis, as prevails in unitary cast single crystal parts) will involve identification of the limiting z axis plane. Practically speaking, the foregoing airfoil geometry parameters commonly do not vary greatly along the critical 40-80% span region, and the selection of a single α for a part is not unduly difficult.

While we have endeavored to specify the angles herein in a definite manner, the angular bounds of our invention should not be too rigorously construed. Our study was for a representative blade, and change of geometry of the airfoil will probably change the optimum angles somewhat. In addition, the [001] axis will not often lie exactly along the z axis, and we use the projection of the secondary axis into the x-y plane, as a practical convenience in defining angles embodying our invention. There will also be some small error in the measurement of crystal orientation.

Figures 16, 17:
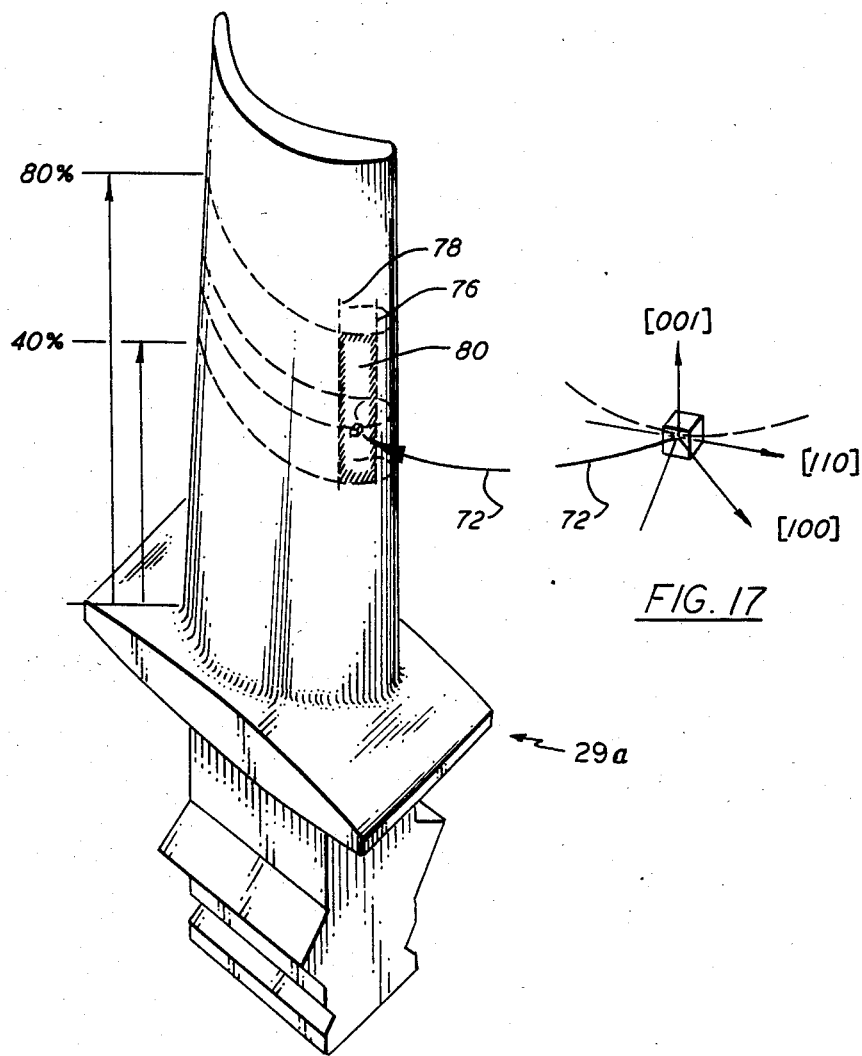
FIG. 16 is a perspective view of a gas turbine blade, showing the critical crack prone region on the suction side of the blade, where control of secondary crystal orientation produces improved thermal fatigue resistance.
FIG. 17 is a greatly enlarged view of a unit crystal cell within the critical region of the airfoil of FIG. 16.

FIGS. 16 and 17 graphically summarize the application of the invention to a turbine blade 29a having its thermal mechanical fatigue durability limited by suction side spanwise cracking. Thus, in the general mode of the invention, the secondary crystal orientation is controlled in the regions most prone to thermal fatigue cracking. Given the high contour of the surface of the gas turbine airfoil which has been shown, it will be seen that the secondary crystal orientation in regions less prone to cracking, such as the body and the trailing edge, will be other than optimum for thermal fatigue. However, since the LADF is comparatively very low in these regions, failure does not occur, and the performance of the total airfoil is optimized.

It should be appreciated that the optimization of secondary orientation we disclose here is for components which are subject to, or limited by combined thermal and mechanical fatigue. If the performance of a single crystal component is limited by other considerations than thermal-mechanical fatigue, other optimum secondary orientations may be found.

Single crystal parts in accord with the invention may be constructed by directionally solidifying molten metals, as disclosed in various U.S. patents. The general technique for forming a single crystal part is disclosed in U.S. Pat. Nos. 3,494,709 and 3,542,120, both to Piearcey. To control secondary orientation, a seed is used. A method in which seeds are used is generally disclosed in U.S. Pat. No. 3,568,757 to Piearcey. Techniques for controlling secondary orientation in articles during casting are disclosed in U.S. Pat. Nos. 3,572,419 to Barrow et al. and 3,598,169 to Copley et al. The manufacture of single crystal turbine blades, both with and without seeding, is disclosed in U.S. Pat. No. 3,857,436 to Petrov et al. The method we prefer is using the high rate directional solidification technique with a seed on the chill plate at the bottom of the ceramic mold, along the lines disclosed by Tschinkel et al. in U.S. Pat. No. 3,915,761.

Parts embodying the invention need not be entirely made of a single crystal structure material. Only the portion which is particularly subject to thermal fatigue and other severe environment need be made of a single crystal. For example, an airfoil portion of single crystal may be fitted with polycrystalline ends, in accord with the teachings of U.S. Pat. Nos. 4,008,052 to Vishnevsky et al and 3,342,564 to Schwartz et al. Also, parts may be made by diffusion bonding multiple parts together, generally in accord with U.S. Pat. No. 4,033,792 to Giamei et al. The portion which is of a single crystal having an orientation in accord with the invention may be bonded to other like orientation parts, or it may be bonded to parts having different orientations or crystal structures. The disclosures of all the foregoing patents are hereby incorporated by reference.

APPENDIX

The practice of the invention requires calculation of the local anisotropic Damage Factor, $\phi$, which is a function of the local elastic modulus $E_{[lmn];\alpha;\psi}$ where [lmn] are the Miller indices of the crystal; $\alpha$ is the angle between the [lmn] axes and the reference and $\psi$ is the angle between the airfoil surface and the [lmn] axis, in accord with FIG. 8.

For completeness, the elastic modulus of a cubic crystal with compliances $S_{11}$, $S_{12}$, $S_{44}$, for any orientation is given by $$[E_{(lmn;\alpha;\psi)}]^{-1} = S_{11} + S_0\{[f_{11}\cos^4\psi + f_{22}\sin^4\psi + (1-3f_{66})\sin^2\psi\cos^2\psi] - 2\sin\psi\cos\psi[f_{16}\cos^2\psi + f_{26}\sin^2\psi]\}$$

where $$S_0 = S_{44} - 2(S_{11} - S_{12})$$

$$f_{11} = \beta_{12}^2\beta_{13}^2 + \beta_{11}^2\beta_{13}^2 + \beta_{11}^2\beta_{12}^2$$
$$f_{22} = \beta_{22}^2\beta_{23}^2 + \beta_{23}^2\beta_{21}^2 + \beta_{21}^2\beta_{22}^2$$
$$f_{16} = \beta_{11}^3\beta_{21} + \beta_{12}^3\beta_{22} + \beta_{13}^3\beta_{23}$$
$$f_{26} = \beta_{21}^3\beta_{11} + \beta_{22}^3\beta_{12} + \beta_{23}^3\beta_{13}$$
$$f_{66} = \beta_{11}^2\beta_{21}^2 + \beta_{12}^2\beta_{22}^2 + \beta_{13}^2\beta_{23}^2$$
$$\beta_{11} = (l\cos\alpha + mn\sin\alpha)/(1-m^2)^{\frac{1}{2}}$$
$$\beta_{12} = -\sin\alpha(1-m^2)^{\frac{1}{2}}$$
$$\beta_{13} = (-n\cos\alpha + ml\sin\alpha)/(1-m^2)^{\frac{1}{2}}$$
$$\beta_{12} = (l\sin\alpha - mn\cos\alpha)/(1-m^2)^{\frac{1}{2}}$$
$$\beta_{22} = \cos\alpha(1-m^2)^{\frac{1}{2}}$$
$$\beta_{23} = (n\sin\alpha + ml\cos\alpha)/(1-m^2)^{\frac{1}{2}}$$
$$\beta_{31} = n \quad \beta_{32} = m \quad \beta_{33} = l$$
$$l = \cos\theta_3 \quad m = \cos\theta_2 \quad n = -\cos\theta_1$$

where $\theta_1$ = angle from [100]
$\theta_2$ = angle from [010]
$\theta_3$ = angle from [001]

If the airfoil stacking line coincides with the crystal axis [001], then $$\theta_1 = 90° \quad \theta_2 = 90° \quad \theta_3 = 0°$$

This is the case when only secondary orientations are of interest, which is precisely the scope of the invention. Then $$l=1 \quad m=0 \quad n=0$$
$$\beta_{11} = \beta_{22} = \cos\alpha \quad \beta_{12} = -\beta_{21} = -\sin\alpha \quad \beta_{33} = 1$$
$$\beta_{13} = \beta_{23} = \beta_{31} = \beta_{32} = 0$$
$$f_{11} = f_{12} = \cos^2\alpha \sin^2\alpha$$
$$f_{16} = \cos^3\alpha \sin\alpha - \sin^3\alpha \cos\alpha$$
$$f_{26} = \sin^3\alpha \cos\alpha - \cos^3\alpha \sin\alpha$$
$$f_{66} = 2\cos^2\alpha \sin^2\alpha$$

The elastic modulus is then given by the relationship $$[E_{(lmn;\alpha;\psi)}]^{-1} = S_{11} + S_0\{[f_{11}\cos^4\psi + f_{22}\sin^4\psi + (1-3f_{66})\sin^2\psi\cos^2\psi] - 2\sin\psi\cos\psi[f_{16}\cos^2\psi + f_{26}\sin^2\psi]\}$$
$$S_0 = S_{44} - 2(S_{11} - S_{12})$$

The normalization can be found by letting the engine axis y and one of the crystal cube axes be coincident; i.e., $\alpha = 0$, then $$f_{11} = f_{22} = f_{16} = f_{26} = f_{66} = 0$$

and $$\{E_{100;\alpha=0;\psi}\}^{-1} = S_{11} + S_0\sin^2\psi\cos^2\psi$$

The local anisotropic damage parameter is defined as $$\phi_i A_1 \exp(A_2 T)(\lambda_i \cdot \Delta\epsilon_i)^{A_3}$$

where $$\lambda_1 = \frac{\{E_{[100];\alpha;\psi}\}}{\{E_{[100];\alpha=0;\psi}\}}$$

Although this invention has been shown and described with respect to a preferred embodiment, it will be understood by those skilled in the art that various changes in form and detail thereof may be made without departing from the spirit and scope of the claimed invention.

We claim:

1. A single crystal article with orthogonal x, y, and z axes, made of a face centered cubic crystal structure metal, having a [001] crystal axis aligned within at least about 20 degrees of the z axis, characterized by a [110] crystal axis of the metal aligned with a tangent to the surface of the article in a region which is prone to thermal fatigue cracks which run in the z axis direction.

2. The article of claim 1, shaped as a hollow aircooled gas turbine component having an airfoil portion, made of a superalloy, characterized by a [110] crystal axis aligned with a tangent to the surface of the airfoil on its convex (suction) side, the thermal fatigue crack prone region lying between 40-80 percent of the airfoil span.

3. The article of claim 2 characterized by a thermal fatigue region bounded in the forward and rearward directions by loci of intercept points, with the surface, of radii of the leading edge circles of the x-y planar cross sections lying between the 40-80 percent span, the radii at each planar section comprising a first radius rotated about 30 degrees forward from the leading edge circle diameter which is perpendicular to the tangent to the mean camber line of the planar section, at the center of the leading edge circle, and a second radius rotated about 45 degrees rearward from the said diameter.

4. The article of claim 3 further characterized by having the first radius angle at 25 degrees and the second radius angle at 35 degrees.

5. The article of claim 1, shaped as a hollow aircooled gas turbine component having an airfoil portion, made of a superalloy, characterized by a [110] crystal axis aligned with a tangent to the surface of the airfoil on its concave (pressure) side, the thermal fatigue prone region lying between 40-80 percent of the airfoil span.

6. The article of claim 5 characterized by a thermal fatigue prone region bounded in the forward and rearward directions by loci of intercept points, with the surface, of radii of the leading edge circles of the x-y planar cross sections lying between 40-80 percent span, the radii at each planar section comprising a first radius coinciding with the leading edge circle diameter which is perpendicular to the tangent to the mean camber line of the planar section, at the center of the leading edge circle, and a second radius rotated about 35 degrees rearward from said diameter.

7. The article of claims 3, 4, or 5 characterized by the thermal fatigue prone region lying between 50-70 percent span.

8. A gas turbine component with orthogonal x, y, and z axes, having a portion shaped as an airfoil made of face centered cubic crystal structure superalloy, the portion having a [001] crystal axis within 20 degrees of the z axis, characterized by the projection in the x-y plane of a [100] crystallographic axis lying within 10 degrees negative and 30 degrees positive rotational angle of the y axis nearest the trailing edge, where positive angular rotation is about the z axis toward the convex side of the airfoil portion.

9. The component of claim 6 further characterized by the projection of the [100] crystallographic axis lying between 0 degrees and 20 degrees positive.

10. The method of producing improved fatigue resistance in an article made of a material having a single crystal portion with a face centered cubic crystal structure and a [001] z axis orientation characterized by controlling the secondary crystal orientation in the region of the single crystal portion which is most prone to thermal fatigue cracking using steps which include (1) selecting at least two angular orientations of the [100] axis with respect to the y axis, said orientations defined by the angle $\alpha$ between the [100] axis and the y axis;

(2) calculating for each angle $\alpha$, such as by finite element analysis, the local anisotropic damage factor $\phi$ for a multiplicity of locations on the surface of the article where $\phi$ is inversely proportional to the fatigue life and is represented by $$\phi = A_1 \exp(A_2 T)(\lambda \cdot \Delta\epsilon)^{A_3}$$

where $$\lambda = \frac{E_{[lmn];\alpha;\psi}}{E_{[100];\alpha=0;\psi}}$$

and where $\psi$ is the angle between the [100] crystal axis and the tangent to the surface at location; $E_{[lmn]}$ and $E_{[100]}$ are the elastic moduli, respectively, of the crystal axis [lmn] aligned with the y axis for a particular $\alpha$, and the crystal axis [100]; and (3) providing in the article an orientation which is associated with a low value of $\phi$, compared to the value of $\phi$ produced by at least one other orientation.

11. The method of producing improved thermal fatigue resistance in an article made of a material having a single crystal portion with a face centered cubic crystal structure and a [001] z axis orientation characterized by controlling the secondary crystal orientation to align the [110] crystal axis with the tangent to the surface in the most thermal fatigue crack prone region.

* * * * *